United States Patent
Sasaki

(10) Patent No.: US 11,133,759 B2
(45) Date of Patent: Sep. 28, 2021

(54) ELECTROSTATIC CHUCK, SUBSTRATE PROCESSING APPARATUS, AND SUBSTRATE HOLDING METHOD

(71) Applicant: TOKYO ELECTRON LIMITED, Tokyo (JP)

(72) Inventor: Yasuharu Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 119 days.

(21) Appl. No.: 16/382,513

(22) Filed: Apr. 12, 2019

(65) Prior Publication Data

US 2019/0319555 A1 Oct. 17, 2019

(30) Foreign Application Priority Data

Apr. 12, 2018 (JP) .............................. JP2018-077066

(51) Int. Cl.
*H02N 13/00* (2006.01)

(52) U.S. Cl.
CPC .................................. *H02N 13/00* (2013.01)

(58) Field of Classification Search
CPC ............. H02N 13/00; H01L 21/67253; H01L 21/67109; H01L 21/6833; H01L 21/6831
USPC ....................................................... 361/234
See application file for complete search history.

(56) References Cited

U.S. PATENT DOCUMENTS

| | | | |
|---|---|---|---|
| 4,692,836 A | 9/1987 | Suzuki | |
| 5,184,398 A * | 2/1993 | Moslehi | C23C 16/4583 257/E21.531 |
| 2001/0055189 A1* | 12/2001 | Hagi | H01L 21/67248 361/234 |
| 2003/0067734 A1* | 4/2003 | Nakano | H02N 13/00 361/234 |
| 2009/0109595 A1* | 4/2009 | Herchen | H01L 21/6831 361/234 |

FOREIGN PATENT DOCUMENTS

| | | |
|---|---|---|
| JP | 2000-124299 A | 4/2000 |
| JP | 2002-009140 A | 1/2002 |
| JP | 2007-288157 A | 11/2007 |

\* cited by examiner

*Primary Examiner* — Dharti H Patel
(74) *Attorney, Agent, or Firm* — Rothwell, Figg, Ernst & Manbeck, P.C.

(57) ABSTRACT

An electrostatic chuck includes a plurality of electrodes configured to generate an electrostatic force for attracting and holding a substrate and a surface on which the substrate is to be mounted. The electrodes are arranged respectively in multiple regions radially and circumferentially defined in the electrostatic chuck. Further, a substrate processing apparatus includes an electrostatic chuck including a plurality of electrodes configured to generate an electrostatic force for attracting and holding a substrate and a surface on which the substrate is to be mounted; and a controller configured to control a timing of applying a DC voltage to each of the electrodes. Each of the electrodes generates an electrostatic force for attracting and holding the substrate by the DC voltage applied thereto, and the electrodes are arranged respectively in multiple regions radially and circumferentially defined in the electrostatic chuck.

5 Claims, 8 Drawing Sheets

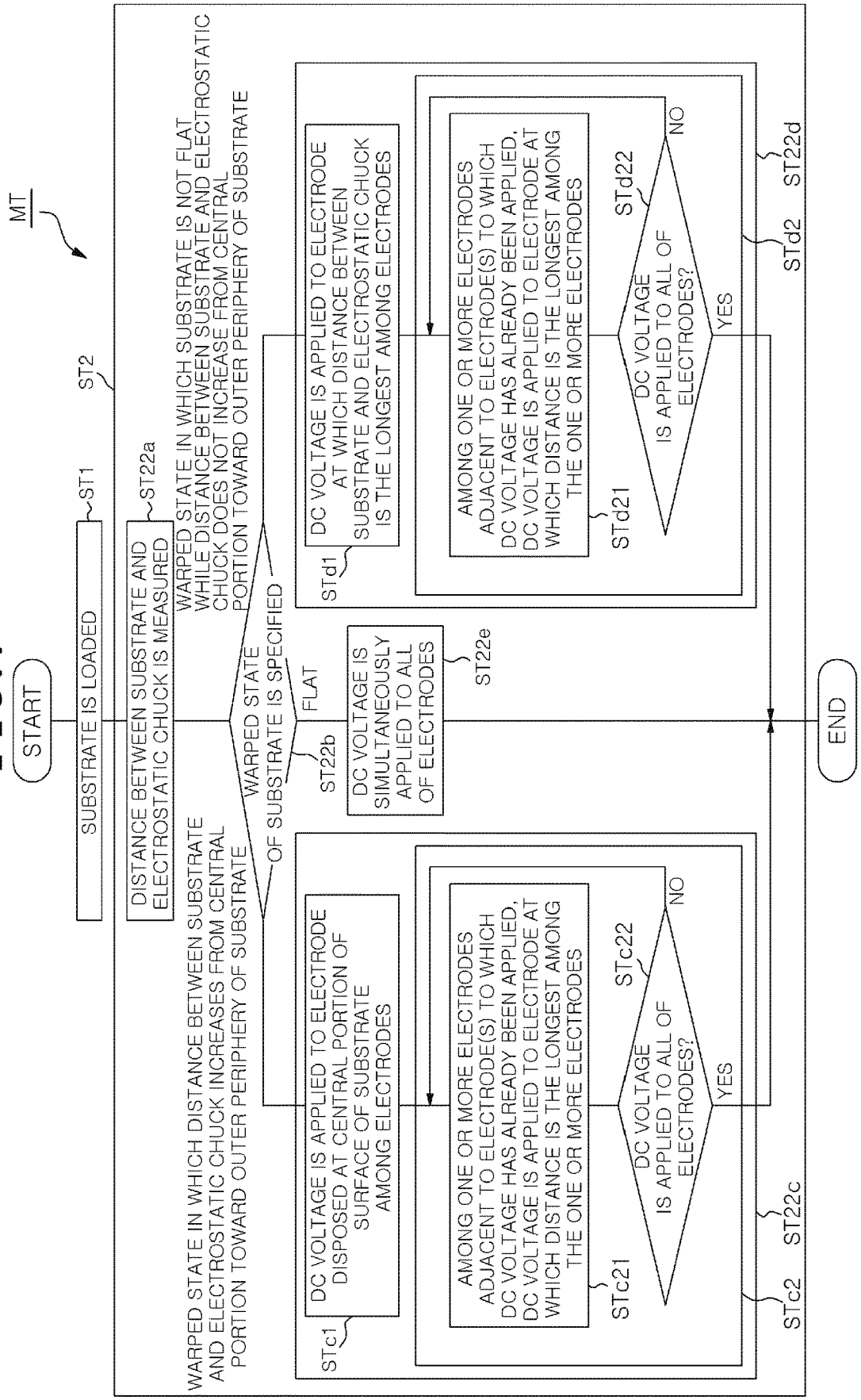

_US 11,133,759 B2_

ELECTROSTATIC CHUCK, SUBSTRATE PROCESSING APPARATUS, AND SUBSTRATE HOLDING METHOD

CROSS-REFERENCE TO RELATED APPLICATIONS

This application claims priority to Japanese Patent Application No. 2018-077066, filed on Apr. 12, 2018, the entire contents of which are incorporated herein by reference.

TECHNICAL FIELD

The present disclosure relates to an electrostatic chuck, a substrate processing apparatus, and a substrate holding method.

BACKGROUND

In manufacturing electronic devices, a substrate is processed by using a substrate processing apparatus. The substrate is processed on a supporting table in a chamber of the substrate processing apparatus. The supporting table includes a base and an electrostatic chuck. The electrostatic chuck is provided on the base.

The electrostatic chuck has a dielectric member and an electrode. The electrode is provided in the dielectric member. The substrate is mounted on the electrostatic chuck. When a DC voltage is applied to the electrode, an electrostatic attractive force is generated between the substrate and the electrostatic chuck. Thus, the substrate is attracted to the electrostatic chuck by the electrostatic attractive force and held on the supporting table by the electrostatic chuck. Techniques related to the electrostatic chuck are disclosed in, e.g., Japanese Patent Application Publication Nos. 2000-124299, 2007-288157, and 2002-9140, and U.S. Pat. No. 4,692,836.

Meanwhile, the substrate may not be flat but warped. However, the surface of the electrostatic chuck on which the substrate is mounted may not have a shape that conforms to the warpage of the substrate. For example, the surface of the electrostatic chuck may be flat. When the warped substrate is held on such an electrostatic chuck, the surface of the substrate is locally not in contact with the surface of the electrostatic chuck and, thus, the contact between the electrostatic chuck and the substrate may deteriorate. Accordingly, in-plane uniformity of the substrate processing may deteriorate. In view of the above, a technique for improving the contact between the substrate and the electrostatic chuck to be close and tight in the case of holding the warped substrate on the supporting table is required.

SUMMARY

In accordance with an aspect, there is provided an electrostatic chuck including: a plurality of electrodes configured to generate an electrostatic force for attracting and holding a substrate; and a surface on which the substrate is to be mounted. The electrodes are arranged respectively in multiple regions radially and circumferentially defined in the electrostatic chuck.

In accordance with another aspect, there is provided a substrate processing apparatus including: an electrostatic chuck including a plurality of electrodes configured to generate an electrostatic force for attracting and holding a substrate and a surface on which the substrate is to be mounted; and a controller configured to control a timing of applying a DC voltage to each of the electrodes. Each of the electrodes generates an electrostatic force for attracting and holding the substrate by the DC voltage applied thereto, and the electrodes are arranged respectively in multiple regions radially and circumferentially defined in the electrostatic chuck.

BRIEF DESCRIPTION OF THE DRAWINGS

The objects and features of the present disclosure will become apparent from the following description of embodiments, given in conjunction with the accompanying drawings, in which:

FIG. 7 shows a substrate holding method according to another embodiment; and

DETAILED DESCRIPTION

Figure 1:
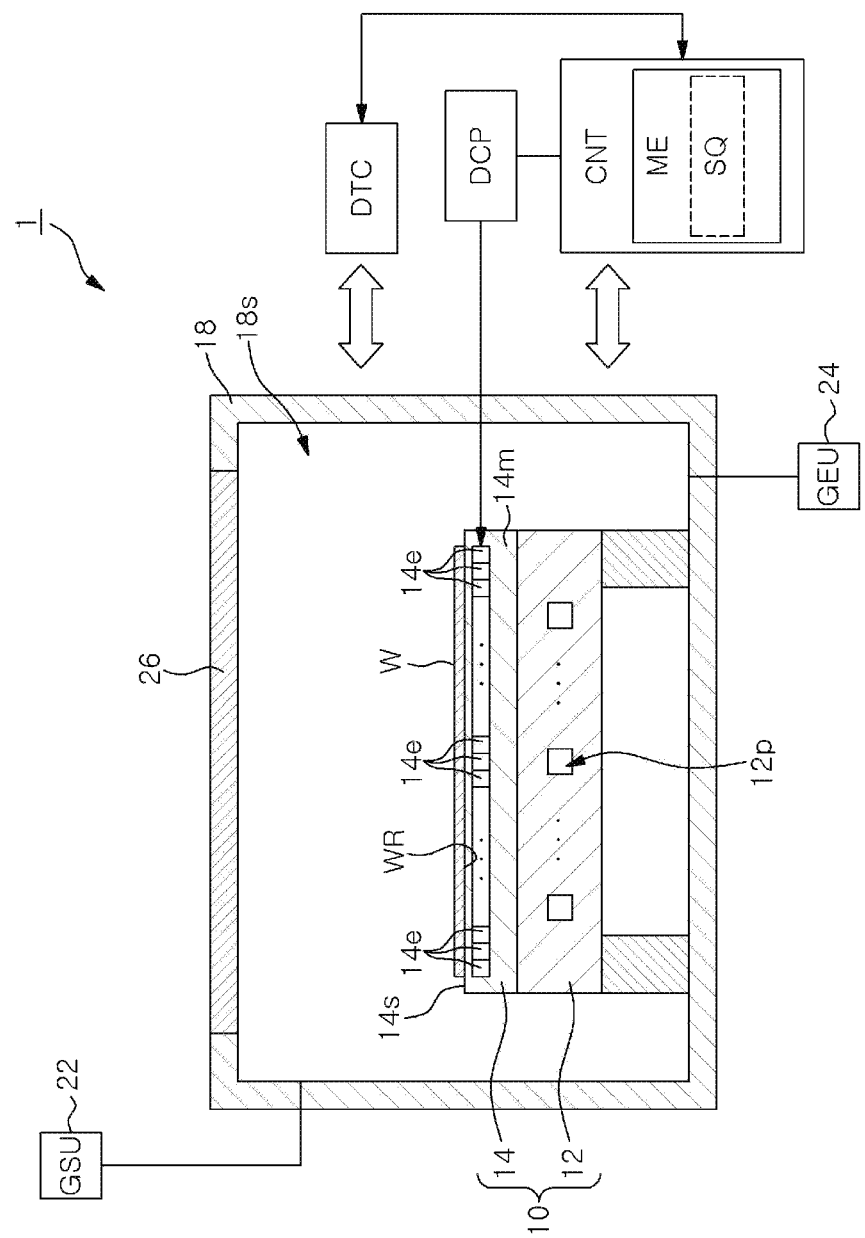
FIG. 1 schematically shows a substrate processing apparatus according to an embodiment.

Hereinafter, embodiments will be described in detail with reference to the accompanying drawings. Like reference numerals will be given to like or corresponding parts throughout the drawings.

Hereinafter, a substrate processing apparatus and an electrostatic chuck according to an embodiment will be described. FIG. 1 is a cross-sectional view schematically showing a substrate processing apparatus 1 and an electrostatic chuck 14 according to an embodiment. The substrate processing apparatus 1 shown in FIG. 1 includes a supporting table 10, a chamber 18, a measurement system DTC, a DC power supply DCP, and a controller CNT.

The supporting table 10 is provided in an inner space 18s of the chamber 18. The supporting table 10 is configured to support the substrate W. The supporting table 10 includes a base 12 and an electrostatic chuck 14.

The base 12 supports the electrostatic chuck 14 and exchanges heat with the electrostatic chuck 14. The base 12 is made of, e.g., aluminum.

In one embodiment, a flow path 12$p$ is formed in the base 12. The flow path 12$p$ may extend, e.g., in a spiral shape in the base 12. A heat exchange medium such as a coolant or the like is supplied from a supply unit (e.g., a chiller unit) provided outside the chamber 18 to the flow path 12$p$, thereby controlling a temperature of the substrate W.

The electrostatic chuck 14 is provided on the base 12. The electrostatic chuck 14 includes a main body 14$m$, a plurality of electrodes 14$e$ for generating an electrostatic force for attracting and holding the substrate W, and a surface 14s on which the substrate W is mounted. The surface 14s is brought into contact with a backside WR of the substrate W when the substrate W is mounted on the electrostatic chuck 14. The main body 14m has a substantially plate-like shape. The main body 14m is made of a dielectric material such as ceramic, e.g., aluminum oxide or aluminum nitride.

Figure 2:
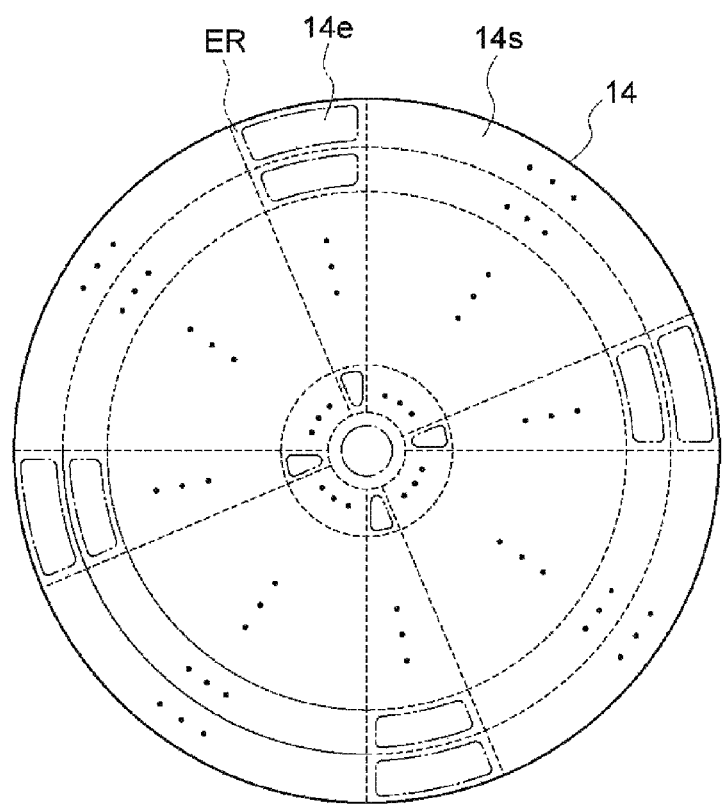
FIG. 2 shows an example of arrangement of a plurality of electrodes of an electrostatic chuck.

The electrodes 14e are provided in the main body 14m. As shown in FIG. 2, the electrodes 14e are arranged respectively in multiple regions ER radially and circumferentially defined (set) in the electrostatic chuck when the main body 14m is viewed from a direction perpendicular to the paper plane. The electrodes 14e are distributed on the surface 14s along the surface 14s.

Since the electrostatic chuck 14 includes the plurality of electrodes 14e arranged in a distributed manner, the substrate W can be brought into close contact with the electrostatic chuck 14 by adjusting the timing of applying a DC voltage to the electrodes 14e.

Figure 3:
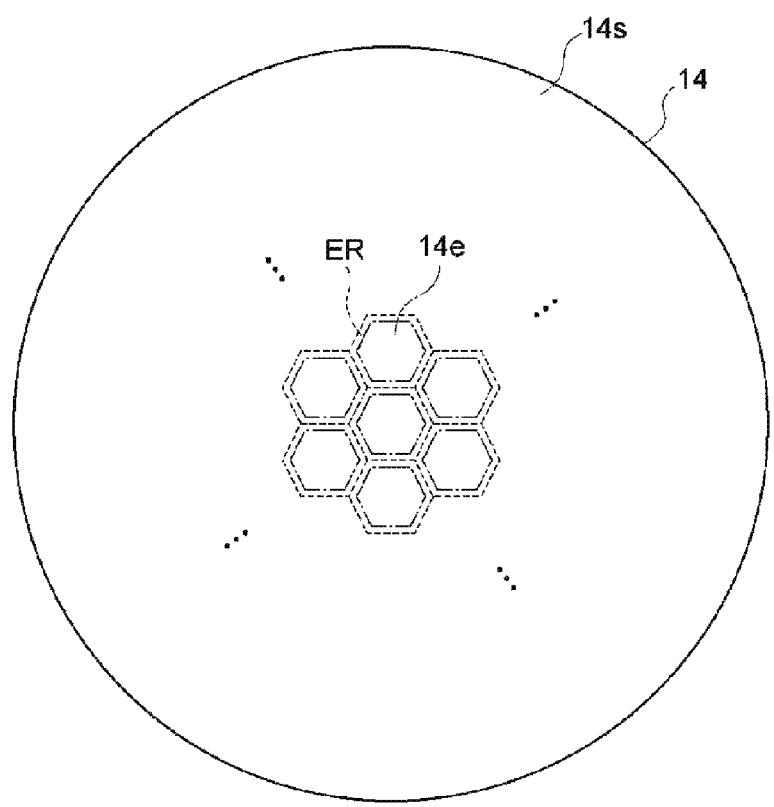
FIG. 3 shows another example of the arrangement of the plurality of electrodes of the electrostatic chuck.

The shape of the region ER and the shape of the electrodes 14e are not limited to those shown in FIG. 2. The electrodes 14e may be arranged in the multiple regions ER radially and circumferentially defined (set) in the electrostatic chuck 14 while being distributed along the surface 14s, as shown in FIG. 2. Alternatively, for example, the region ER and the electrodes 14e may have the shapes shown in FIG. 3. FIG. 3 shows another example of the arrangement of the electrodes 14e of the electrostatic chuck 14. In FIG. 3, there are illustrated regions ER and electrodes 14e having a hexagonal honeycomb-shape.

The substrate processing apparatus 1 includes a DC power supply DCP. The DC power supply DCP applies a DC voltage to the electrodes 14e.

In one embodiment, the measurement system DTC is configured to measure, for each of the electrodes 14e, a distance (hereinafter, referred to as "distance Lgap") between the electrostatic chuck 14 and the substrate W mounted on the surface 14s of the electrostatic chuck 14. More specifically, the measurement system DTC is configured to measure, for each of the electrodes 14e, the distance Lgap between the surface 14s of the electrostatic chuck 14 and the backside WR of the substrate W mounted on the surface 14s of the electrostatic chuck 14.

Figure 4:
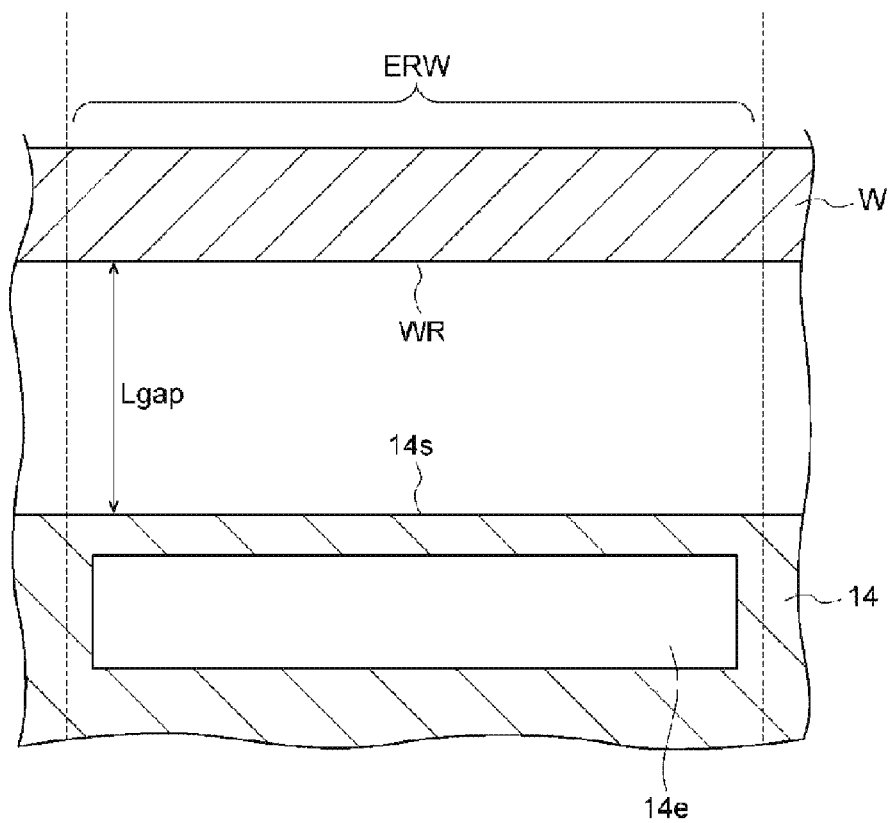
FIG. 4 explains a method of measuring a distance between a substrate and the electrostatic chuck.

For example, as shown in FIG. 4, the distance (Lgap) measurement of the measurement system DTC for each of the electrodes 14e may be carried out by measuring an electrostatic capacitance Cgap between each of the electrodes 14e and a region ERW in the substrate W above the corresponding electrode. In this case, the measurement system DTC calculates the distance Lgap between the electrostatic chuck 14 and the substrate W mounted on the surface 14s of the electrostatic chuck 14 from the electrostatic capacitance Cgap measured by the measurement system DTC. As the electrostatic capacitance Cgap becomes greater, the distance Lgap becomes smaller. In other words, as the electrostatic capacitance Cgap becomes greater, the distance Lgap between the surface 14s of the electrostatic chuck 14 and the backside WR of the substrate W mounted on the surface 14s of the electrostatic chuck 14 becomes smaller. It is preferable that the distance Lgap is zero in the entire backside WR of the substrate W. In this case, the closest contact between the substrate W and the electrostatic chuck 14 is obtained.

Alternatively, the distance (Lgap) measurement of the measurement system DTC can be performed by various methods other than the above-described method using the electrostatic capacitance Cgap.

For example, the measurement system DTC may include an optical distance measuring device. In this case, a method of using the optical distance measuring device may be used to measure the distance Lgap. As another example, the measurement system DTC may be configured to measure a heat capacity of the substrate W in each of the electrodes 14e and calculate the distance Lgap by using the measured heat capacity. As still another example, the measurement system DTC may be configured to measure an electric resistance between the substrate W and the electrostatic chuck 14 in each of the electrodes 14e and calculate the distance Lgap by using the measured electric resistance.

The DC power supply DCP is configured to apply a DC voltage to each of the electrodes 14e by a control signal transmitted from the controller CNT.

The controller CNT is configured to control the respective components of the substrate processing apparatus 1. The controller CNT is connected to the DC power supply DCP, the measurement system DTC, and other components of the substrate processing apparatus 1. The controller CNT transmits and receives various control signals and measurement data between the DC power supply DCP, the measurement system DTC, and other components of the substrate processing apparatus 1.

The controller CNT includes a CPU, a memory, and a storage device (e.g., a storage device ME). The controller CNT generates various control signals by loading various programs stored in the storage device ME into the memory and causing the CPU to execute those programs, and transmits the control signals to the respective components of the substrate processing apparatus 1. The above-described various programs may be programs for executing one of substrate holding methods MT to be described with reference to the flowcharts of FIGS. 5, 7, and 8, for example. The controller CNT controls the operations of the respective components of the substrate processing apparatus 1 by using various measurement data transmitted from the measurement system DTC.

Particularly, the controller CNT controls the operation of the DC power supply DCP based on various measurement data transmitted from the measurement system DTC, thereby controlling the timing of applying the DC voltage to each of the electrodes 14e.

In the substrate processing apparatus 1, the controller CNT performs any one of the substrate holding method MT (first example) to be described with reference to the flowchart of FIG. 5, the substrate holding method MT (second example) to be described with reference to the flowchart of FIG. 7, and the substrate holding method MT (third example) to be described with reference to the flowchart of FIG. 8. With such methods, the contact between the substrate W mounted on the electrostatic chuck 14 and the electrostatic chuck 14 can be improved to be close and tight.

As described above, the electrostatic chuck 14 of the substrate processing apparatus 1 includes the plurality of electrodes 14e arranged in a distributed manner. Therefore, the substrate W can be brought into close and tight contact with the electrostatic chuck 14 by adjusting the timing of applying the DC voltage to each of the electrodes 14e under the control of the controller CNT.

In one embodiment, the substrate processing apparatus 1 may further include a gas supply unit (GSU) 22. The gas supply unit 22 supplies a gas for processing the substrate W, i.e., a gas used for substrate processing, to the inner space 18s. In one embodiment, the substrate processing apparatus 1 may further include a gas exhaust unit (GEU) 24. The gas exhaust unit 24 is configured to evacuate the gas in the inner space 18s and reduce a pressure in the inner space 18s. The gas exhaust unit 24 includes, e.g., a pressure control valve and a depressurization pump.

The processing performed on the substrate W in the substrate processing apparatus 1 may be any substrate processing. In one embodiment, the substrate processing apparatus 1 may be configured to perform plasma processing on the substrate W. In this embodiment, the substrate processing apparatus 1 includes a plasma generation unit 26. The plasma generation unit 26 is configured to provide energy for exciting a gas in the inner space 18s. The plasma generation unit 26 may be any type of plasma generating device. The plasma generation unit 26 may be, e.g., a capacitively coupled plasma generating device, an inductively coupled plasma generating device, or a plasma generating device that generates plasma by a surface wave such as a microwave.

Hereinafter, a plurality of examples (the first example, the second example and the third example) of the substrate holding method MT according to an embodiment will be described with reference to FIGS. 5, 7 and 8, together with 6. FIG. 5 shows the first example of the substrate holding method MT according to the embodiment. FIG. 7 shows the second example of the substrate holding method MT according to the embodiment. FIG. 8 shows the third example of the substrate holding method MT according to the embodiment.

Figure 5:
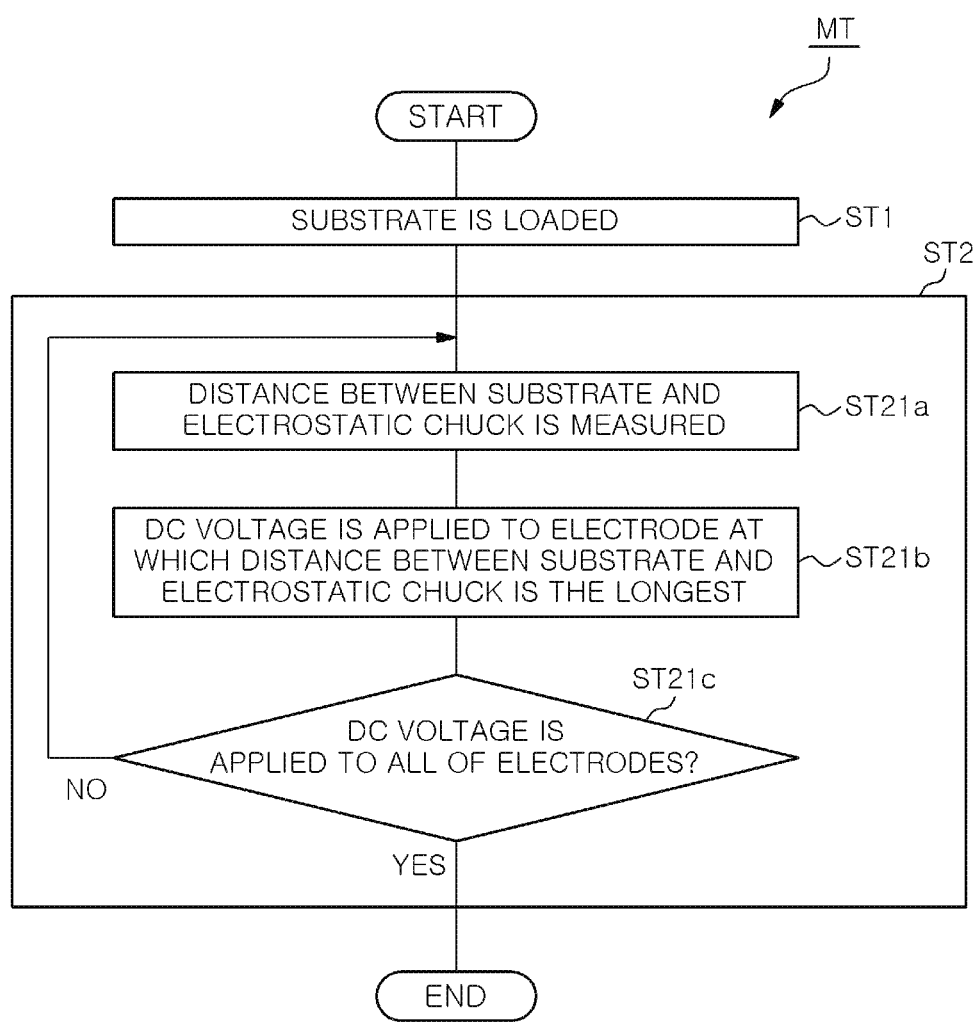
FIG. 5 shows a substrate holding method according to an embodiment.
Figure 6A:
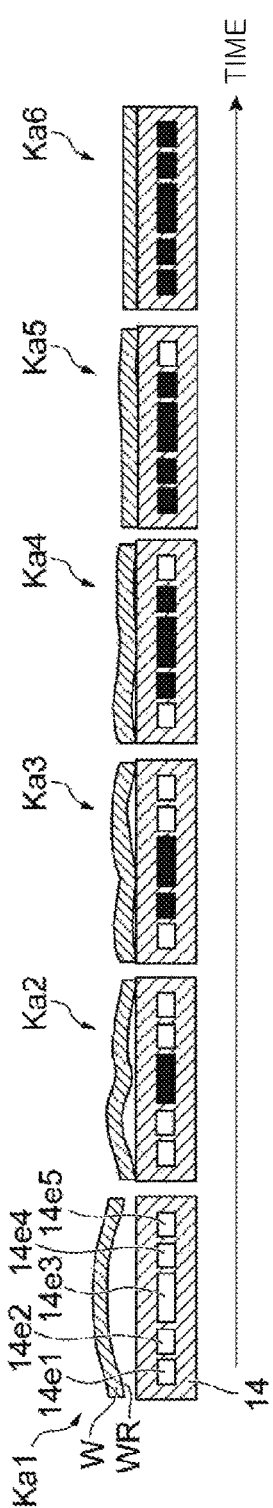
FIG. 6A shows an example of attracting and holding the substrate on the electrostatic chuck by using the method shown in FIG. 5.
Figure 6B:
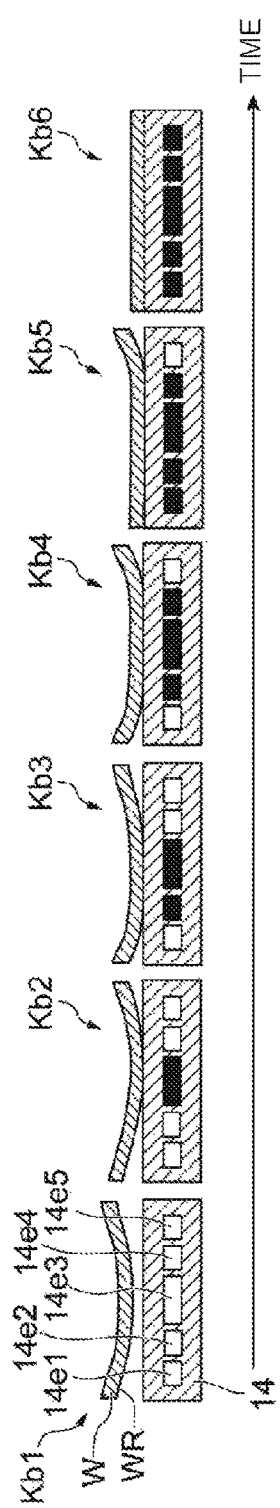
FIG. 6B shows an example of attracting and holding a warped substrate on the electrostatic chuck by using a method shown in FIG. 7.
Figure 6C:
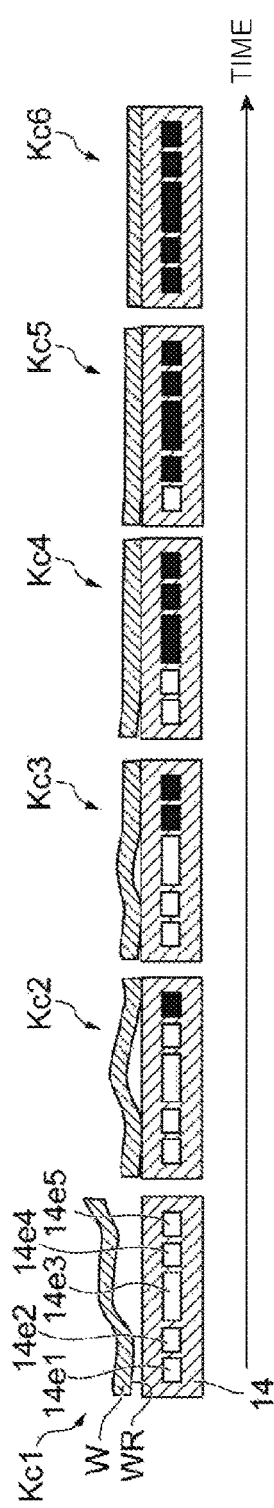
FIG. 6C shows an example of attracting and holding another warped substrate on the electrostatic chuck by using the method shown in FIG. 7.

FIG. 6A shows an example of attracting and holding the substrate W on the electrostatic chuck 14 by using the substrate holding method MT shown in FIG. 5. FIG. 6B shows an example of attracting and holding a warped substrate W on the electrostatic chuck 14 by using the substrate holding method MT shown in FIG. 7. FIG. 6C shows an example of attracting and holding another warped substrate W on the electrostatic chuck 14 by using the substrate holding method MT shown in FIG. 7.

For the sake of convenience of description, FIGS. 6A to 6C show the configurations in which the electrostatic chuck 14 includes five electrodes 14e (14e1 to 14e5). The electrodes 14e in black in FIGS. 6A to 6C indicate the electrodes to which the DC voltage is applied. The electrodes 14e1 to 14e5 are arranged along the surface 14s, in that order.

The electrode 14e1 is disposed at an outer periphery of the surface 14s. The electrode 14e5 is disposed at an outer periphery of the surface 14s which is opposite to the side where the electrode 14e1 is disposed. The electrode 14e3 is disposed at the central portion of the surface 14s. The electrode 14e2 is disposed between the electrode 14e1 and the electrode 14e3. The electrode 14e4 is disposed between the electrode 14e3 and the electrode 14e5.

All of the first to the third example include steps ST1 and ST2. In step ST1, the substrate W is loaded into the inner space 18s in the chamber 18 and mounted on the surface 14s of the electrostatic chuck 14. Next, in step ST2, the timing of applying a DC voltage to each of the electrodes 14e is adjusted.

The electrostatic chuck 14 having the substrate W thereon includes the plurality of electrodes 14e arranged in a distributed manner. Therefore, by executing step ST2 of the first to the third example, the controller CNT controls the timing of applying the DC voltage to each of the electrodes 14e, which makes it possible to improve the contact between the substrate W and the electrostatic chuck 14 to be close and tight.

The substrate holding method MT shown in FIG. 5 and the substrate holding method MT shown in FIG. 7 are performed by controlling the respective components of the substrate processing apparatus 1 including the measurement system DTC under the control of the controller CNT. The substrate holding method MT shown in FIG. 8 is performed by controlling the respective components of the substrate processing apparatus 1 by using a plurality of application sequences SQ stored in the storage device ME under the control of the controller CNT.

In the first to the third example, the controller CNT is configured to enable the same DC voltage to be applied from the DC power supply DCP to each of the electrodes 14e. Alternatively, in the first to the third example, the value of the DC voltage applied from the DC power supply DCP can be adjusted for each of the electrodes 14e to make the distance Lgap more uniform. Since the value of the DC voltage applied to each of the electrodes 14e can be adjusted based on the distance Lgap between the substrate W and the electrostatic chuck 14, it is possible to further improve the contact between the substrate W and the electrostatic chuck 14 to be close and tight.

First Example

The substrate holding method MT of the first example will be described with reference to FIG. 5. The controller CNT performs the substrate holding method MT of the first example shown in the flowchart of FIG. 5. In the first example, the controller CNT controls the DC power supply DCP to apply a DC voltage to each of the electrodes 14e in the order of the distance Lgap.

Step ST2 subsequent to step ST1 includes steps ST21a, ST21b, and ST21c.

In step ST21a subsequent to step ST1, the measurement system DTC measures, for each of the electrodes 14e, a distance Lgap between the surface 14s of the electrostatic chuck 14 and the backside WR of the substrate W mounted on the surface 14s of the electrostatic chuck 14.

In step ST21b subsequent to step ST21a, the DC voltage is applied to each of the electrodes 14e in the order of the distance Lgap.

In step ST21c subsequent to step ST21b, it is determined whether or not all of the electrodes 14e of the electrostatic chuck 14 have been subjected to the processing of step ST21a and the processing of step ST21b. In other words, it is determined whether or not the DC voltage is applied to all of the electrodes 14e of the electrostatic chuck 14.

If it is determined in step ST21c that the DC voltage is applied merely to some of the electrodes 14e of the electrostatic chuck 14 (that is, there are electrodes 14e to which no DC voltage is applied) (NO in step ST21c), steps ST21a and 21b are executed again. If it is determined in step ST21c that the electrode 14e to which no DC voltage is applied is the last electrode 14e, steps ST21a and 21b are not executed. In that case, the DC voltage is applied to the last electrode 14e and, then, it is determined that the DC voltage is applied to all of the electrodes 14e (YES in step ST21c). Thereafter, the substrate holding method MT is terminated.

The substrate holding method MT of the first example shown in FIG. 5 will be described in detail with reference to FIG. 6A. The substrate W shown in FIG. 6A has a warped state in which the distance Lgap between the backside WR of the substrate W and the surface 14s of the electrostatic chuck 14 increases from the outer periphery toward the central portion of the substrate W. In other words, in this warped state, the central portion of the substrate W is raised toward the upper side of the surface 14s of the electrostatic chuck 14. Hereinafter, this will be referred to as "warped state WS." First, in a state Ka1, the substrate W is mounted on the surface 14s of the electrostatic chuck 14.

In a state Ka2 subsequent to the state Ka1, steps ST21a and ST21b are executed, and a DC voltage is initially applied to the electrode 14e3 at which the longest distance Lgap is measured.

In a state Ka3 subsequent to the state Ka2, steps ST21a and ST21b are executed again, and the DC voltage is further applied to the electrode 14e2 at which the longest distance Lgap is measured at a starting point of the state Ka3.

In a state Ka4 subsequent to the state Ka3, steps ST21a and ST21b are executed again, and the DC voltage is further applied to the electrode 14e4 at which the longest distance Lgap is measured at a starting point of the state Ka4. In a state Ka5 subsequent to the state Ka4, steps ST21a and ST21b are executed again, and the DC voltage is further applied to the electrode 14e1 at which the longest distance Lgap is measured at a starting point of the state Ka5. In a state Ka6 subsequent to the state Ka5, the DC voltage is further applied to the last electrode 14e5 to which no DC voltage is applied.

As described above, by applying a DC voltage to each of the electrodes 14e in the order of the longest to shortest distance Lgap, the substrate W can be brought into close contact with the electrostatic chuck 14 and, thus, the improved close contact can be achieved. Further, high in-plane uniformity can be obtained when the substrate W being in very close contact with the electrostatic chuck 14 is processed.

Second Example

The substrate holding method MT of the second example will be described with reference to FIG. 7. The controller CNT performs the substrate holding method MT of the second example shown in the flowchart of FIG. 7. In the second example, the controller CNT specifies a warped state of the substrate W mounted on the surface 14s of the electrostatic chuck 14 based on the distance Lgap, and applies a DC voltage to each of the electrodes 14e based on the specified warped state.

Step ST2 shown in FIG. 7 which is subsequent to step ST1 includes steps ST22a, ST22b, ST22c, ST22d, and ST22e. Step ST22c includes steps STc1 and STc2. Step STc2 includes steps STc21 and STc22. Step ST22d includes steps STd1 and STd2. Step STd2 includes steps STd21 and STd22.

In step ST22a subsequent to step ST1, the distance Lgap between the electrostatic chuck 14 and the backside WR of the substrate W mounted on the surface 14s of the electrostatic chuck 14 is measured for each of the electrodes 14e. In step ST22b subsequent to step ST22a, the warped state of the substrate W mounted on the surface 14s of the electrostatic chuck 14 is specified based on the distance Lgap.

In step ST2 shown in FIG. 7, each of steps ST22c, ST22d, and ST22e is executed based on the warped state of the substrate W which is specified in step ST22b. In each of steps ST22c, ST22d, and ST22e, the timing of applying a DC voltage to each of the electrodes 14e is controlled.

In step ST22b, if the warped state of the substrate W is specified to a warped state (warped state WS) in which the distance Lgap increases from the central portion toward the outer periphery of the substrate W, the processing proceeds to step ST22c.

In step ST22b, if the warped state of the substrate W is specified to a warped state in which the substrate W is not in the warped state WS (that is, the distance Lgap does not increase from the central portion toward the outer periphery of the substrate W), but the substrate W is not flat, the processing proceeds to step ST22d. If the warped state of the substrate W is specified to a warped state that the substrate W is flat in step ST22b, the processing proceeds to step ST22e.

Now, step ST22c will be described in detail. If the warped state of the substrate W is specified in step ST22b to the warped state WS in which the distance Lgap increases from the central portion toward the outer periphery of the substrate W, steps STc1 and STc2 are executed in that order in step ST22c.

In step STc1, a DC voltage is initially applied to an electrode disposed at the central portion of the surface 14s among the electrodes 14e.

In step STc2, a process (step STc21) is performed such that, among one or more electrodes 14e adjacent to the electrode(s) 14e to which the DC voltage has already been applied, the DC voltage is applied to an electrode at which the distance Lgap is the longest among the one or more electrodes 14e. This process is repeated by executing step STc22 until the DC voltage is applied to all of the electrodes 14e.

In step STc21, the distance Lgap is measured for each of the electrodes 14e by using the measurement system DTC, and the measured distance Lgap is used for selecting a target electrode of the electrodes 14e to which the DC voltage is to be applied.

If it is determined in step STc22 that the DC voltage is not applied to all of the electrodes 14e of the electrostatic chuck 14 (that is, there are electrodes 14e to which no DC voltage is applied) (NO in step STc22), step STc21 is executed again. If it is determined that in step STc22 that the electrode 14e to which no DC voltage is applied is the last electrode 14e, step STc21 is not executed. In this case, the DC voltage is applied to the last electrode 14e and, then, it is determined that the DC voltage is applied to all of the electrodes 14e (YES in step STc22). Thereafter, the substrate holding method MT is terminated.

Step ST22c of the substrate holding method MT of the second example shown in FIG. 7 will be described in detail with reference to FIG. 6B. The substrate W shown in FIG. 6B has a warped state (warped state WS) in which the distance Lgap increases from the central portion toward the outer periphery of the substrate W. First, in a state Kb1, the substrate W is mounted on the surface 14s of the electrostatic chuck 14.

In a state Kb2 subsequent to the state Kb1, step STc1 is executed, and a DC voltage is initially applied to the electrode 14e3 disposed at the central portion of the surface 14s.

In a state Kb3 subsequent to the state Kb2, step STc21 is executed. At a starting point of the state Kb3, among one or more electrodes 14e (e.g., the electrodes 14e2 and 14e4) adjacent to the electrode 14e3 to which the DC voltage has already been applied, the DC voltage is applied to the electrode 14e2 at which the distance Lgap is the longest.

In a state Kb4 subsequent to the state Kb3, step STc21 is executed again. At a starting point of the state Kb4, among one or more electrodes 14e (e.g., the electrodes 14e1 and 14e4) adjacent to the electrodes 14e2 and 14e3 to which the DC voltage has already been applied, the DC voltage is applied to the electrode 14e4 at which the distance Lgap is the longest.

In a state Kb5 subsequent to the state Kb4, step STc21 is executed again. At a starting point of the state Kb5, among one or more electrodes 14e (the electrodes 14e1 and 14e5)

adjacent to the electrodes 14e2, 14e3, and 14e4 to which the DC voltage has already been applied, the DC voltage is applied to the electrode 14e1 at which the distance Lgap is the longest.

In a state Kb6 subsequent to the state Kb5, the DC voltage is further applied to the last electrode 14e5 to which no DC voltage is applied.

By executing step ST22c, when the warped state of the substrate W is specified to the warped state in which the distance Lgap increases from the central portion toward the outer periphery of the substrate W, the central portion of the backside WR of the substrate W is initially attracted and held on the electrostatic chuck 14, and thereafter the backside WR of the substrate W is attracted and held sequentially from the central portion toward the outer periphery thereof. Therefore, the electrostatic attraction between the substrate W and the electrostatic chuck 14 can be performed stably.

Next, Step ST22d will be described in detail. In step ST22b, the warped state of the substrate W may be specified to a warped state in which the substrate W is not in the warped state WS (that is, the distance Lgap does not increase from the central portion toward the outer periphery of the substrate W), but the substrate W is not flat. In this step ST22d, steps STd1 and STd2 are executed in that order. In step STd1, a DC voltage is initially applied to an electrode at which the longest distance Lgap is measured among the electrodes 14e.

In step STd2, a process (step STd21) is performed such that, among one or more electrodes 14e adjacent to the electrode(s) 14e to which the DC voltage has already been applied, the DC voltage is applied to an electrode at which the distance Lgap is the longest among the one or more electrodes 14e. This process is repeated by executing step STd22 until the DC voltage is applied to all of the electrodes 14e.

In step STd21, the distance Lgap is measured for each of the electrodes 14e by using the measurement system DTC, and the measured distance Lgap is used for selecting a target electrode of the electrodes 14e to which the DC voltage is to be applied.

If it is determined in step STd22 that the DC voltage is not applied to all of the electrodes 14e of the electrostatic chuck 14 (that is, there are electrodes 14e to which no DC voltage is applied) (NO in step STd22), step STd21 is executed again. In the step STd22, the electrode 14e to which no DC voltage is applied may be the last electrode. In this case, the step STd21 is not executed, and a DC voltage is applied to the last electrode 14e and, then, it is determined that the DC voltage is applied to all of the electrodes 14e (YES in step STd22). Thereafter, the substrate holding method MT is terminated.

Step ST22d of the substrate holding method MT of the second example shown in FIG. 7 will be described in detail with reference to FIG. 6C. The substrate W shown in FIG. 6C has a warped state in which the substrate W is not in the warped state WS (that is, the distance Lgap does not increase from the central portion toward the outer periphery of the substrate W), but the substrate W is not flat. First, in a state Kc1, the substrate W is mounted on the surface 14s of the electrostatic chuck 14.

In a state Kc2 subsequent to the state Kc1, step STd1 is executed, and a DC voltage is initially applied to the electrode 14e5 at which the longest distance Lgap is measured among the electrodes 14e.

In the state Kc3 subsequent to the state Kc2, step STd21 is executed. At a starting point of the state Kc3, among one or more electrodes 14e (e.g., the electrode 14e4) adjacent to the electrode 14e5 to which the DC voltage has already been applied, the DC voltage is applied to an electrode at which the distance Lgap is the longest among the one or more electrodes 14e. In FIG. 6C, only the electrode 14e4 is the target electrode of the electrodes 14e to which the DC voltage is applied after the state Kc2.

In a state Kc4 subsequent to the state Kc3, step STd21 is executed again. At a starting point of the state Kc4, among one or more electrodes 14e (e.g., the electrode 14e3) adjacent to the electrodes 14e5 and 14e4 to which the DC voltage has already been applied, the DC voltage is applied to an electrode at which the distance Lgap is the longest among the one or more electrodes 14e. In FIG. 6C, only the electrode 14e3 is the target electrode of the electrodes 14e to which the DC voltage is applied after the state Kc3.

In a state Kc5 subsequent to the state Kc4, step STd21 is executed again. At a starting point of the state Kc5, among one or more electrodes 14e (e.g., the electrode 14e2) adjacent to the electrodes 14e5, 14e4 and 14e3 to which the DC voltage has already been applied, the DC voltage is applied to an electrode at which the distance Lgap is the longest among the one or more electrodes 14e. In FIG. 6C, only the electrode 14e2 is the target electrode of the electrodes 14e to which the DC voltage is applied after the state Kc4. In a state Kc6 subsequent to the state Kc5, the DC voltage is further applied to the last electrode 14e1 to which no DC voltage is applied.

By executing step ST22d, the warped state of the substrate W may be specified to a warped state in which the substrate W is not flat and the distance Lgap does not increase from the central portion toward the outer periphery of the substrate W. In this case, the substrate W is initially attracted and held on the electrostatic chuck 14 at the electrode 14e at which the longest distance Lgap is measured among the electrodes 14e and, then, the substrate W is sequentially attracted and held on the electrostatic chuck 14 at the other electrodes 14e around the attracted portion of the substrate W. Therefore, the substrate W can be stably attracted and held on the electrostatic chuck 14.

Next, Step ST22e will be described. When it is determined in step ST22b that the state of the substrate W is specified that the substrate W is flat with no warped portion, step ST22e is executed. In step ST22e, the DC voltage is simultaneously applied to all of the electrodes 14e of the electrostatic chuck 14.

As described above, in the second example, the timing of applying the DC voltage to each of the electrodes 14e is controlled based on the warped state of the substrate W and, thus, the DC voltage can be applied depending on the warped state of the substrate W while satisfactory contact between the substrate W and the electrostatic chuck 14 is obtained. Therefore, the substrate W can be brought into close contact with the electrostatic chuck 14, thereby achieving the improved close contact. Further, high in-plane uniformity can be obtained when the substrate W being in very close contact with the electrostatic chuck 14 is processed.

Third Example

The substrate holding method MT of the third example will be described with reference to FIG. 8. The controller CNT performs the substrate holding method MT of the third example shown in the flowchart of FIG. 8. In the third example, there is provided a plurality of application sequences SQ each of which specifies the sequence of application of the DC voltage to each of the electrodes 14e. In step ST2, the controller CNT selects one application sequence SQ corresponding to the case where the closest contact between the substrate W and the electrostatic chuck is obtained based on the distance Lgap among the application sequences SQ. The controller CNT controls the timing of applying the DC voltage to each of the electrodes by using the selected application sequence SQ. The application sequences SQ are prepared in advance and distinguished from each other by, e.g., identifiers.

Figure 8:
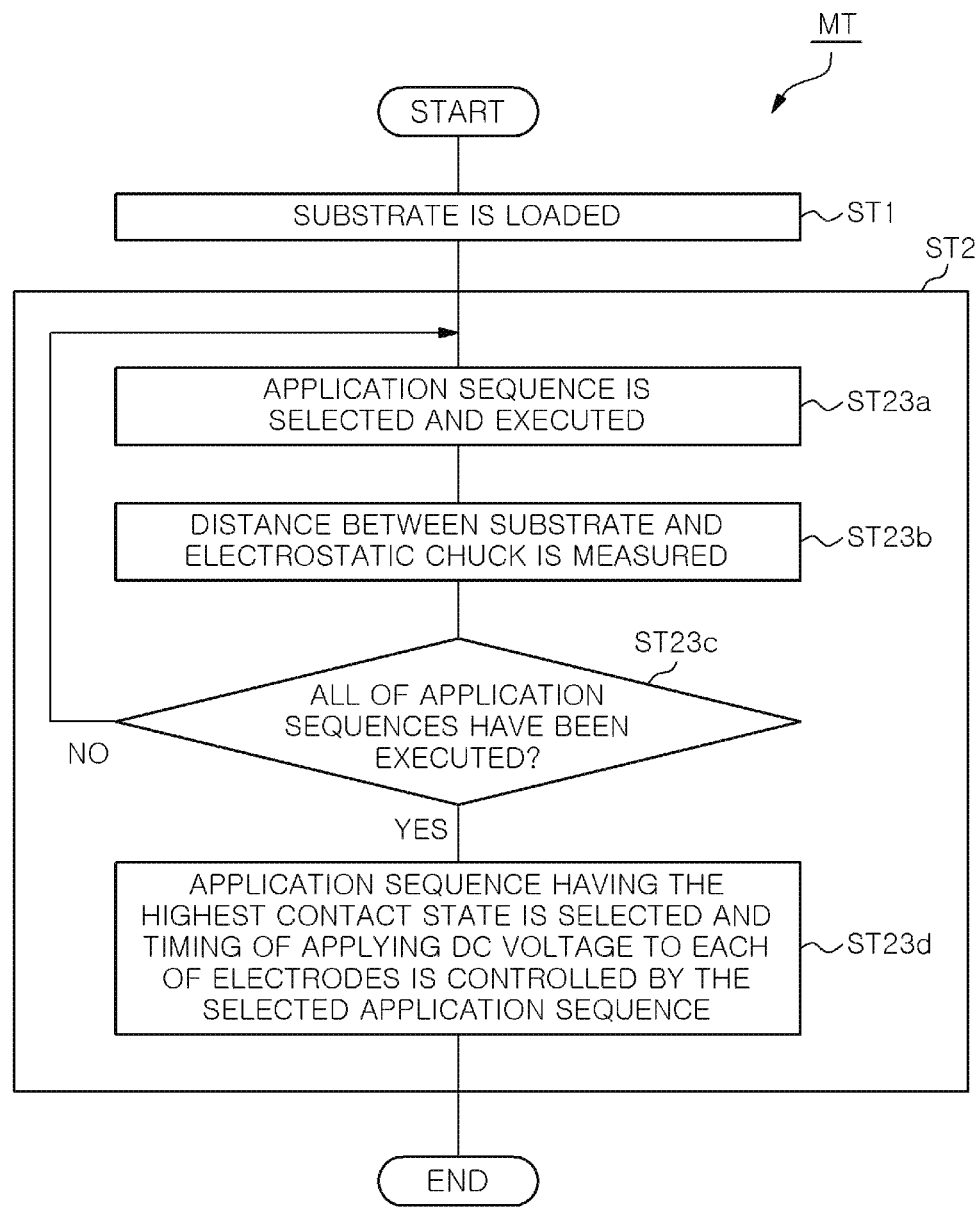
FIG. 8 shows a substrate holding method according to still another embodiment.

Step ST2 shown in FIG. 8 subsequent to step ST1 includes steps ST23a, ST23b, ST23c, and ST23d. In step ST23a subsequent to step ST1, among the application sequences SQ stored in the storage device ME of the controller CNT, one application sequence SQ is selected from one or more application sequences SQ that have not yet been executed in step ST2. In step ST23a, the timing of applying the DC voltage to each of the electrodes 14e is controlled by using the selected application sequence SQ. By executing step ST23a, the substrate W is attracted and held on the electrostatic chuck 14.

In step ST23b subsequent to step ST23a, the distance Lgap between the substrate W and the electrostatic chuck 14 is measured in a state where the substrate W is attracted and held on the electrostatic chuck 14 in step ST23a. More specifically, in step ST23b, the measurement system DTC measures the distance Lgap between the backside WR of the substrate W and the surface 14s of the electrostatic chuck 14 for each of the electrodes 14e of the electrostatic chuck 14.

In step ST23b, a numerical value indicating the contact state between the substrate W and the electrostatic chuck 14 is calculated based on the measured distances Lgap, and the calculated numerical value indicating the contact state is stored together with the identifier of the selected application sequences SQ in the memory of the controller CNT.

In step ST23c subsequent to step ST23b, it is determined whether or not there are one or more application sequences SQ that have not yet been executed. If it is determined in step ST23c that there are one or more application sequences SQ that have not yet been executed (NO in step ST23c), steps ST23a and ST23b are executed again.

If it is determined in step ST23c that there is no application sequence SQ that has not yet been executed (that is, all of the application sequences SQ stored in the storage device ME have been executed) (YES in step ST23c), the processing proceeds to step ST23d.

In step ST23d, an application sequence SQ having the highest numerical value is selected among multiple numerical values indicating the contact states stored in the memory for respective application sequences SQ, and the timing of applying the DC voltage to each of the electrodes 14e is controlled by using the selected application sequence SQ.

As described above, in the third example, there is provided a plurality of application sequences SQ each of which specifies the sequence of application of the DC voltage to each of the electrodes 14e, and, among this prepared application sequences SQ, an application sequence SQ corresponding to the case where the closest contact between the substrate W and the electrostatic chuck 14 is obtained is selected. In the third example, the timing of applying the DC voltage to each of the electrodes 14e is controlled by using the selected application sequence SQ. Therefore, the DC voltage can be applied while satisfactory contact between the substrate W and the electrostatic chuck 14 is ensured. Accordingly, the substrate W can be brought into close contact with the electrostatic chuck 14, thereby achieving the improved close contact. Further, high in-plane uniformity can be obtained when the substrate W being in very close contact with the electrostatic chuck 14 is processed.

In the above example, the evaluation of the contact state (the numerical value indicating the contact state) between the substrate W and the electrostatic chuck 14 may be performed by various methods. For example, the value indicating the contact state may be obtained by using the distance Lgap. In this case, the value indicating the contact state may be variation (e.g., standard deviation) in the distances Lgap measured in all of the electrodes 14e. Further, the value indicating the contact state may be obtained by using a temperature of the substrate W. In this case, the value indicating the contact state may be variation (e.g., standard deviation) in temperatures of the substrate W measured in all of the electrodes 14e. Moreover, the value indicating the contact state may be obtained by using a result of actual processing performed on the substrate W. When the processing is etching, the value may be variation (e.g., standard deviation) in etching rates. When the processing is film formation, the value may be variation (e.g., standard deviation) in film thicknesses of a formed film, or an evaluation value of a film quality. In any of the methods, as the contact state is improved, the variation in the values indicating the contact state is suppressed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:
1. A substrate processing apparatus comprising:
an electrostatic chuck including a plurality of electrodes configured to generate an electrostatic force for attracting and holding a substrate and a surface on which the substrate is to be mounted;
a controller configured to control a timing of applying a DC voltage to each of the electrodes; and
a measurement system configured to measure a distance between the electrostatic chuck and the substrate mounted on the surface of the electrostatic chuck,
wherein each of the electrodes generates an electrostatic force for attracting and holding the substrate by the DC voltage applied thereto,
the electrodes are arranged respectively in multiple regions radially and circumferentially defined in the electrostatic chuck,
the measurement system measures the distance for each of the electrodes,
the controller specifies a warped state of the substrate mounted on the surface of the electrostatic chuck based on the distance, and controls the timing of applying the DC voltage such that the DC voltage is applied to each of the electrodes based on the specified warped state, and
when the warped state of the substrate is specified to a warped state in which the distance increases from a central portion toward an outer periphery of the substrate, the controller controls the timing of applying the DC voltage such that the DC voltage is initially applied to an electrode disposed at the central portion of the substrate among the electrodes, and a process, in which the DC voltage is applied to an electrode with the longest distance among one or more electrodes adjacent to the electrode(s) to which the DC voltage has already been applied, is repeated.

2. The substrate processing apparatus of claim 1, wherein when the warped state of the substrate is specified to a warped state in which the substrate is not flat and the distance does not increase from the central portion toward the outer periphery of the substrate, the controller controls the timing of applying the DC voltage such that the DC voltage is initially applied to an electrode at which the distance is the longest among the electrodes, and a process, in which the DC voltage is applied to an electrode with the longest distance among one or more electrodes adjacent to the electrode(s) to which the DC voltage has already been applied, is repeated.

3. The substrate processing apparatus of claim 1, wherein the controller adjusts a value of the DC voltage to be applied to each of the electrodes.

4. A substrate processing apparatus comprising:
an electrostatic chuck including a plurality of electrodes configured to generate an electrostatic force for attracting and holding a substrate and a surface on which the substrate is to be mounted;
a controller configured to control a timing of applying a DC voltage to each of the electrodes; and
a measurement system configured to measure a distance between the electrostatic chuck and the substrate mounted on the surface of the electrostatic chuck,
wherein each of the electrodes generates an electrostatic force for attracting and holding the substrate by the DC voltage applied thereto,
the electrodes are arranged respectively in multiple regions radially and circumferentially defined in the electrostatic chuck,
the measurement system measures the distance for each of the electrodes,
the controller specifies a warped state of the substrate mounted on the surface of the electrostatic chuck based on the distance, and controls the timing of applying the DC voltage such that the DC voltage is applied to each of the electrodes based on the specified warped state, and
wherein when the warped state of the substrate is specified to a warped state in which the substrate is not flat and the distance does not increase from a central portion toward an outer periphery of the substrate, the controller controls the timing of applying the DC voltage such that the DC voltage is initially applied to an electrode at which the distance is the longest among the electrodes, and a process, in which the DC voltage is applied to an electrode with the longest distance among one or more electrodes adjacent to the electrode(s) to which the DC voltage has already been applied, is repeated.

5. The substrate processing apparatus of claim 4, wherein the controller adjusts a value of the DC voltage to be applied to each of the electrodes.

* * * * *